(12) United States Patent
Mao et al.

(10) Patent No.: US 11,810,928 B2
(45) Date of Patent: Nov. 7, 2023

(54) CMOS IMAGE SENSOR WITH LED FLICKERING REDUCTION AND LOW COLOR CROSS-TALK

(71) Applicant: OMNIVISION TECHNOLOGIES, INC., Santa Clara, CA (US)

(72) Inventors: Duli Mao, Sunnyvale, CA (US); Bill Phan, San Jose, CA (US); Seong Yeol Mun, Santa Clara, CA (US); Yuanliang Liu, San Jose, CA (US); Alireza Bonakdar, San Jose, CA (US); Chengming Liu, Fremont, CA (US); Zhiqiang Lin, Fremont, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 331 days.

(21) Appl. No.: 17/322,536

(22) Filed: May 17, 2021

(65) Prior Publication Data
US 2022/0367542 A1    Nov. 17, 2022

(51) Int. Cl.
*H01L 27/146* (2006.01)

(52) U.S. Cl.
CPC .... *H01L 27/14605* (2013.01); *H01L 27/1465* (2013.01); *H01L 27/14621* (2013.01); *H01L 27/14623* (2013.01); *H01L 27/14625* (2013.01); *H01L 27/14627* (2013.01); *H01L 27/14685* (2013.01)

(58) Field of Classification Search
CPC .......... H01L 27/14605; H01L 27/1462; H01L 27/14623; H01L 27/14685
See application file for complete search history.

(56) References Cited

U.S. PATENT DOCUMENTS

| | | | | |
|---|---|---|---|---|
| 7,262,404 | B2* | 8/2007 | Yamaguchi | H01L 27/14627 257/E31.127 |
| 9,666,631 | B2* | 5/2017 | Lyu | H01L 27/14641 |
| 2022/0003907 | A1* | 1/2022 | Borremans | H04N 23/88 |
| 2022/0271081 | A1* | 8/2022 | Chao | H01L 27/14621 |
| 2023/0178571 | A1* | 6/2023 | Tetz | H04N 25/585 348/230.1 |

\* cited by examiner

*Primary Examiner* — David A Zarneke
(74) *Attorney, Agent, or Firm* — Christensen O'Connor Johnson Kindness PLLC

(57) ABSTRACT

CMOS image sensor with LED flickering reduction and low color cross-talk are disclosed. In one embodiment, an image sensor includes a plurality of pixels arranged in rows and columns of a pixel array that is disposed in a semiconductor substrate. Each pixel includes a plurality of large subpixels (LPDs) and at least one small subpixel (SPD). A plurality of color filters are disposed over individual subpixels. Each individual SPD is laterally adjacent to at least one other SPD.

20 Claims, 7 Drawing Sheets

CMOS IMAGE SENSOR WITH LED FLICKERING REDUCTION AND LOW COLOR CROSS-TALK

BACKGROUND INFORMATION

Field of the Disclosure

This disclosure relates generally to the design of image sensors, and in particular, relates to image sensors that are suitable for high dynamic range imaging.

Background

Image sensors have become ubiquitous. They are widely used in digital still cameras, cellular phones, security cameras, as well as medical, automotive, and other applications. The technology for manufacturing image sensors continues to advance at a great pace. For example, the demands for higher image sensor resolution and lower power consumption motivate further miniaturization and integration of image sensors into digital devices.

In some applications, a dynamic range of a nature scene may be larger than the dynamic range of image sensors. Capturing such images having high dynamic ranges (HDRs) is typically done with image sensors that include photodiodes with differing sensitivities. However, when images include light emitting diodes (LEDs), LED flicker may occur, especially so for the LEDs that are controlled by pulse width modulation (PWM), because camera exposure may miss the LED pulse. Flickering issues may become even more relevant for the HDR capture, since the bright part of image is usually captured using shorter exposure time of the image sensor, therefore making it more likely that the image sensor misses the active part of the PWM. For car viewing systems, LED flicker may cause dangerous situations as drivers may interpret flickering LEDs to represent emergency lights. Furthermore, an automated driver assistance system (ADAS) may fail to detect road signs and traffic signals due to LED flickering.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
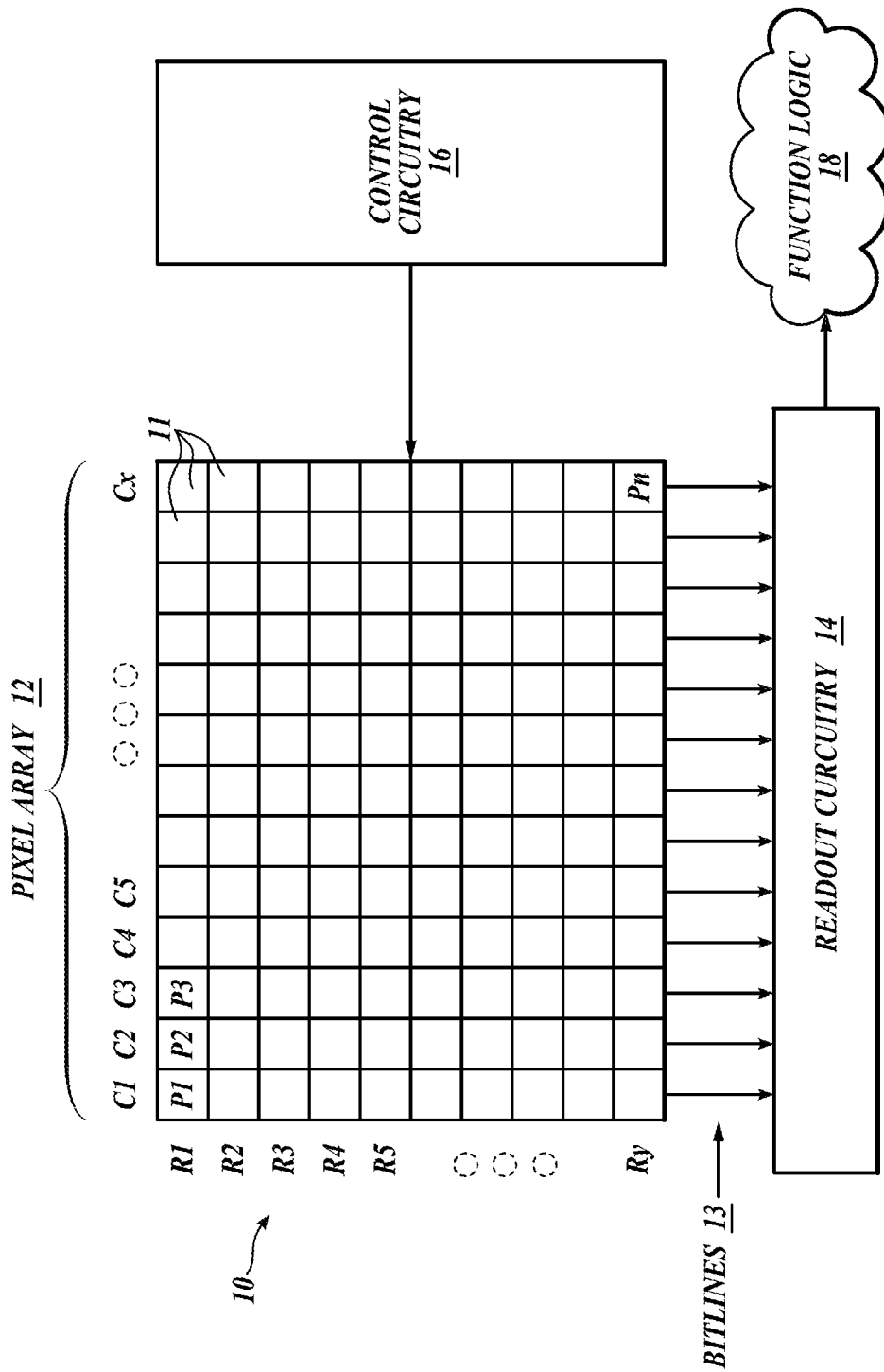
FIG. 1 is a diagram of an example image sensor in accordance with an embodiment of the present technology.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Image sensors, and in particular, complementary metal oxide semiconductor (CMOS) image sensor with LED flickering reduction and low color cross-talk are disclosed. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

From the foregoing, it will be appreciated that specific embodiments of the technology have been described herein for purposes of illustration, but that various modifications may be made without deviating from the disclosure. Moreover, while various advantages and features associated with certain embodiments have been described above in the context of those embodiments, other embodiments may also exhibit such advantages and/or features, and not all embodiments need necessarily exhibit such advantages and/or features to fall within the scope of the technology. Where methods are described, the methods may include more, fewer, or other steps. Additionally, steps may be performed in any suitable order. Accordingly, the disclosure can encompass other embodiments not expressly shown or described herein. In the context of this disclosure, the term "about" means+/−5% of the stated value.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Briefly, the embodiments of the present technology are directed to CMOS image sensor having pixels with multiple sensitivities. In some embodiments, individual pixels of the image sensor may be subdivided into subpixels, each having one or more photo diodes. The subpixels may be referred to as large subpixels (LPD) and small subpixels (SPD) even though they have the same size, the difference being that the SPD's sensitivity to light is reduced by forming a light attenuation layer over the SPD. In some embodiments, one pixel may include 3 LPDs and 1 SPD. Other ratios of LPDs and SPDs are also possible in other embodiments. In combination, the LPDs and SPDs provide required dynamic range and sensitivity of the image sensor.

In many embodiments, cross-talk from LPDs to SPDs affects overall accuracy of the image sensor more significantly because SPDs have higher sensitivity to the incoming stray light generated by cross-talk. Additionally, keeping everything else equal, the SPDs may be less sensitive to cross-talk if the stray light arrives from the subpixels of same color. Therefore, in some embodiments the SPDs are arranged such that they are subject to cross-talk from (1) other SPDs and (2) the LPDs of the same color, which reduces the impact of cross-talk on the SPDs. In some embodiments, such arrangement of SPDs results in a localized clustering of the SPDs that may in turn reduce the resolution of the image sensor. However, in many situations this may be an acceptable trade-off, especially so if the light from the flickering LEDs is included in the image.

FIG. 1 is a diagram of an example image sensor 10 in accordance with an embodiment of the present technology. The image sensor 10 includes a pixel array 12, a control circuitry 16, a readout circuitry 14 and a function logic 18. In one example, the pixel array 12 is a two-dimensional (2D) array of photodiodes or image sensor pixels 11 (e.g., pixels P1, P2 . . . , Pn). In different embodiments, two or more image sensor pixels 11 may be grouped to a plurality of pixel cells. As illustrated, the photodiodes are arranged into rows (e.g., rows R1 to Ry) and columns (e.g., columns C1 to Cx). In operation, the photodiodes acquire image data of a scene, which can then be used to render a 2D image of person, place, object, etc. However, in other embodiments the photodiodes may be arranged into configurations other than rows and columns.

In an embodiment, after each pixel 11 in the pixel array 12 acquires its image charge, the image data is read out by the readout circuitry 14 via bitlines 13, and then transferred to a function logic 18. The readout image data of each pixel 11 collectively constitute an image frame. In various embodiments, the readout circuitry 14 may include signal amplifiers, analog-to-digital (ADC) conversion circuitry and data transmission circuitry. The function logic 18 may store the image data or even manipulate the image data by applying post image effects (e.g., crop, rotate, remove red eye, adjust brightness, adjust contrast, or otherwise). In some embodiments, the control circuitry 16 and function logic 18 may be combined into a single functional block to control the capture of images by the pixels 11 and the readout of image data from the readout circuitry 14. The function logic 18 may include a digital processor. In an embodiment, the readout circuitry 14 may read one row of image data at a time along readout column lines (bitlines 13) or may read the image data using a variety of other techniques, such as a serial readout or a full parallel readout of all pixels simultaneously.

In one embodiment, the control circuitry 16 is coupled to the pixel array 12 to control operation of the plurality of photodiodes in the pixel array 12. For example, the control circuitry 16 may generate a shutter signal for controlling image acquisition. In one embodiment, the shutter signal is a global shutter signal for simultaneously enabling all pixels within the pixel array 12 to simultaneously capture their respective image data during a single data acquisition window. In another embodiment, the shutter signal is a rolling shutter signal such that each row, column or group of pixels is sequentially enabled during consecutive acquisition windows. In another embodiment, image acquisition is synchronized with lighting effects such as a flash. In different embodiments, the control circuitry 16 may be configured to control each of pixels 11 to perform the acquiring operations of one or more dark current pixel frames for image calibration and normal image frames.

In one embodiment, readout circuitry 14 includes analog-to-digital converters (ADCs), which convert analog image data received from the pixel array 12 into a digital representation. The digital representation of the image data may be provided to the function logic 18.

In different embodiments, image sensor 10 may be part of a digital camera, cell phone, laptop computer, or the like. Additionally, image sensor 10 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to the image sensor 10, extract image data from the image sensor 10, or manipulate image data supplied by image sensor 10.

Voltage values of the individual pixels ($P_1$-$P_n$) can be captured by the readout circuitry 14. For example, a control circuitry 16 may determine a specific row $R_i$ of the pixel array 12 for coupling with the readout circuitry 14. After the pixel values in row $R_i$ are captured, the control circuitry 16 may couple row $R_{i+1}$ with the readout circuitry 14, and the process repeats until voltage values of all the pixels in the column are captured. In other embodiments, the readout circuitry 14 may readout the image data using a variety of other techniques (not illustrated in FIG. 1), such as a serial readout or a full parallel readout of all pixels simultaneously. In different embodiments, the readout circuitry 14 may include amplification circuitry, analog-to-digital conversion ("ADC") circuitry, or other circuitry. In some embodiments, the pixel values are captured and processed by the function logic 18. Such processing may, for example, include image processing, image filtering, image extraction and manipulation, determination of light intensity, etc.

Figure 2:
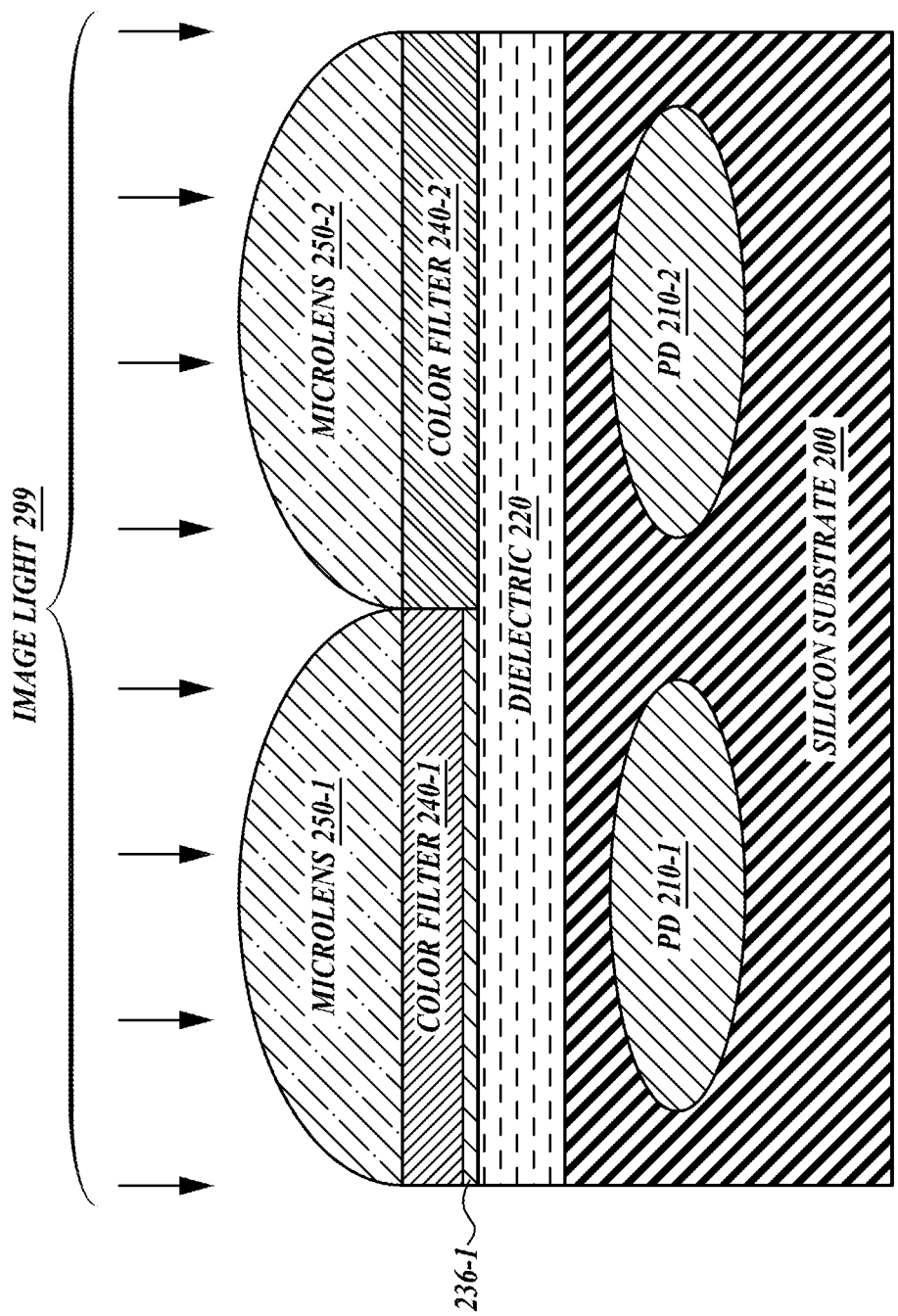
FIG. 2 is a cross-sectional view of an example image sensor in accordance with an embodiment of the present technology.

FIG. 2 is a cross-sectional view of an example image sensor in accordance with an embodiment of the present technology. Two subpixels having photodiodes (PDs) 210-1 and 210-2 are illustrated for simplicity. Generally, an image sensor includes many pixels, and each pixel may include multiple photodiodes. For example, the photodiodes 210-1 and 210-2 (also referred to as "cells" or "subpixels") may constitute one pixel. In the illustrated embodiment, a first photodiode 210-1 may be configured to capture bright light and a second photodiode 210-2 may be configured to capture low light as explained in more detail below.

In the illustrated embodiment, a first microlens 250-1 and a first color filter 240-1 are stacked over the first photodiode 210-1 (SPD). A second microlens 250-2 and a second color filter 240-2 are stacked over the second photodiode 210-2 (LPD). The first photodiode 210-1 and second photodiode 210-2 may be disposed in the same semiconductor material, which is illustrated as a silicon substrate 200. The first photodiode 210-1 and the second photodiode 210-2 may have same size and same dopant concentrations, resulting in the same full well capacity. In an embodiment, the first photodiode 210-1 and the second photodiode 210-2 have the same light exposure area, where the light exposure area is defined as the area of the photodiode seen when looking down at the photodiode through the center of its corresponding microlens.

In some embodiments, color filters 240 pass a specific color of image light 299 (e.g., red, green, or blue) while substantially blocking the image light that is different than the specific filter color. A dielectric layer 220 is disposed between silicon substrate 200 and color filters 240. The dielectric layer 220 may include Low-Pressure Chemical Vapor Deposition ("LPCVD") silicon dioxide or spun-on silicon dioxide.

The left subpixel in the illustrated combination of subpixels also includes a light attenuation element 236-1 in the stack. In different embodiments, the light attenuation layer may be made of different materials and structures. As a result, the amount of light that reaches the photodiode 210-1 is less than the amount of light that reaches the adjacent photodiode 210-2, everything else being equal.

In operation, the first microlens 250-1 directs the incoming image light 299 through the first color filter 240-1 and through the light attenuation element 236-1 toward the first photodiode 210-1. The second microlens 250-2 and the second color filter 240-2 are stacked over the second photodiode 210-2. In the illustrated example, the combination of color filter 240-1 and the light attenuation element 236-1 is less transmissive to light than is the color filter 240-2 alone. As a result, the photodiode 210-2 (the LPD photodiode) receives more image light 299 than the first photodiode 210-1 (the SPD photodiode) during the same exposure.

In an embodiment, color filters 240 are formed as a layer of metal that is approximately fifty nanometers thick. In one embodiment, the material of color filters 240 includes a transparent photoresist that is impacted by a plasma of Nitrogen atoms to reduce transparency of the material. In yet another embodiment, the color filters 240-1 and 240-2 are made from polytetrafluoroethylene ("PTFE") that includes additives (e.g., titanium dioxide) to adjust transparency as desired. In the context of this specification, term "color filter" encompasses both color filters and gray scale filters.

Figure 3:
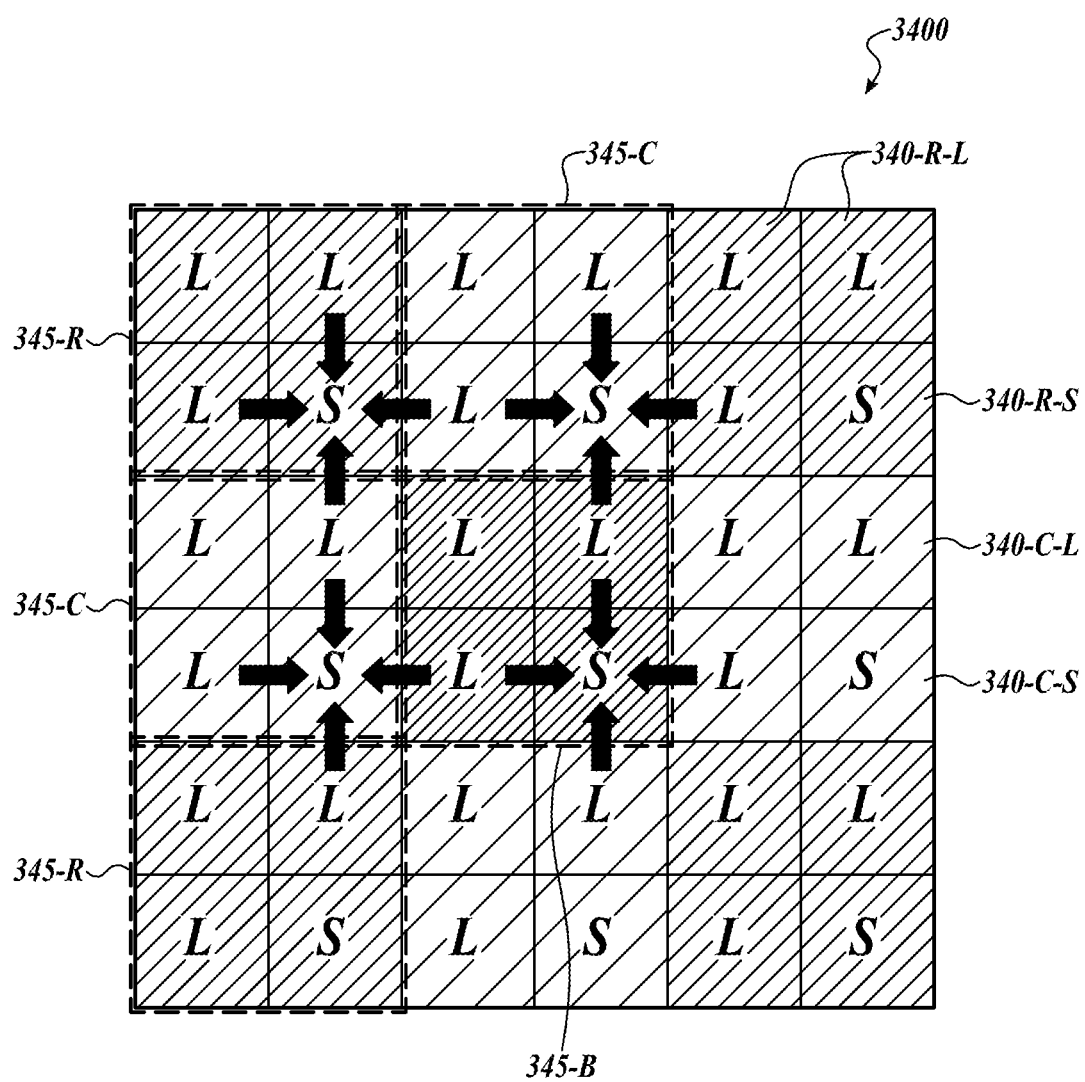
FIGS. 3 and 4 are top schematic views of photodiode arrangements in accordance with embodiments of the present technology.
Figure 4:
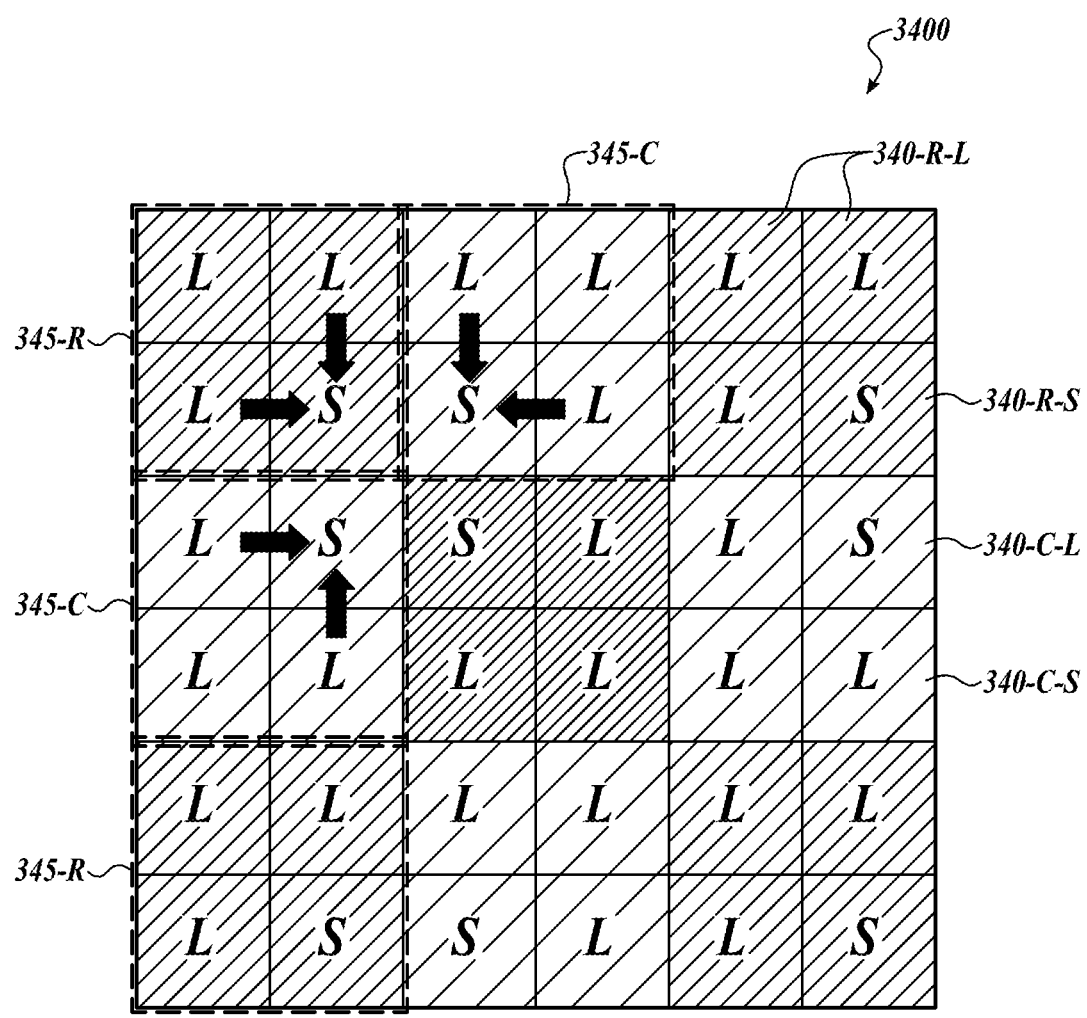

FIGS. 3 and 4 are top schematic views of photodiode arrangements in accordance with embodiments of the present technology. Both figures show a simplified representation of an image sensor having an array of 2×2 pixels 345. These pixels are enumerated as 345-R for the red pixel, 345-B for the blue pixel, and 345-C for the clear or green pixel. Each illustrated pixel 345 includes 4 subpixels 340. For example, the red pixel 345-R includes three subpixels 340-R-L designating large subpixels LPD and one subpixel 340-R-S designating small subpixel SPD. The blue pixel 345-B and the clear (or green) pixel 345-C are analogously composed. In different embodiments, different arrangements of pixels and subpixels may be used. Solid arrows indicate direction of the stray light toward the SPD subpixels. As explained above, the SPDs are generally more sensitive to the stray light contamination (cross-talk) than are the LPDs, because of the smaller overall light intensity that the SPDs are subjected to in operation.

FIG. 3 illustrates an arrangement of subpixels where each SPD subpixel receives stray light from 4 surrounding (adjacent) LPD subpixels, 2 subpixels belonging to the same pixel (same color) and 2 subpixels belonging different pixels (different color). In general, stray light coming from subpixels having different color causes higher contamination of the SPD than the stray light coming from subpixels belonging to the same pixel. In many embodiments, the arrangement illustrated in FIG. 3 may result in significant contamination of the SPD's reading, causing deterioration in the overall accuracy of the image sensor 3400.

FIG. 4 illustrates an arrangement of subpixels where each SPD subpixel receives stray light from 2 surrounding LPD subpixels belonging to the same pixel (therefore, being of same color). Here, each SPD is laterally surrounded by (laterally adjacent to) 2 LPDs and 2 SPDs, in comparison to each SPD being laterally surrounded by 4 LPD in the arrangement illustrated in FIG. 3. As explained above, stray light received by an adjacent SPD is typically a less significant source of noise for the receiving SPD and, therefore, not marked by a solid arrow in the illustrated image sensor 3400. Furthermore, the two laterally adjacent LPDs belong to the same pixel (same color). The diagonally adjacent LPDs of different color generally contribute less light contamination (noise) to the SPDs, therefore being of a lesser concern.

In some embodiments, clustering 4 SPDs together may degrade the resolution of small features in the image. However, such loss of resolution may in many embodiments be an acceptable trade-off in view of reduced cross-talk.

Figure 5:
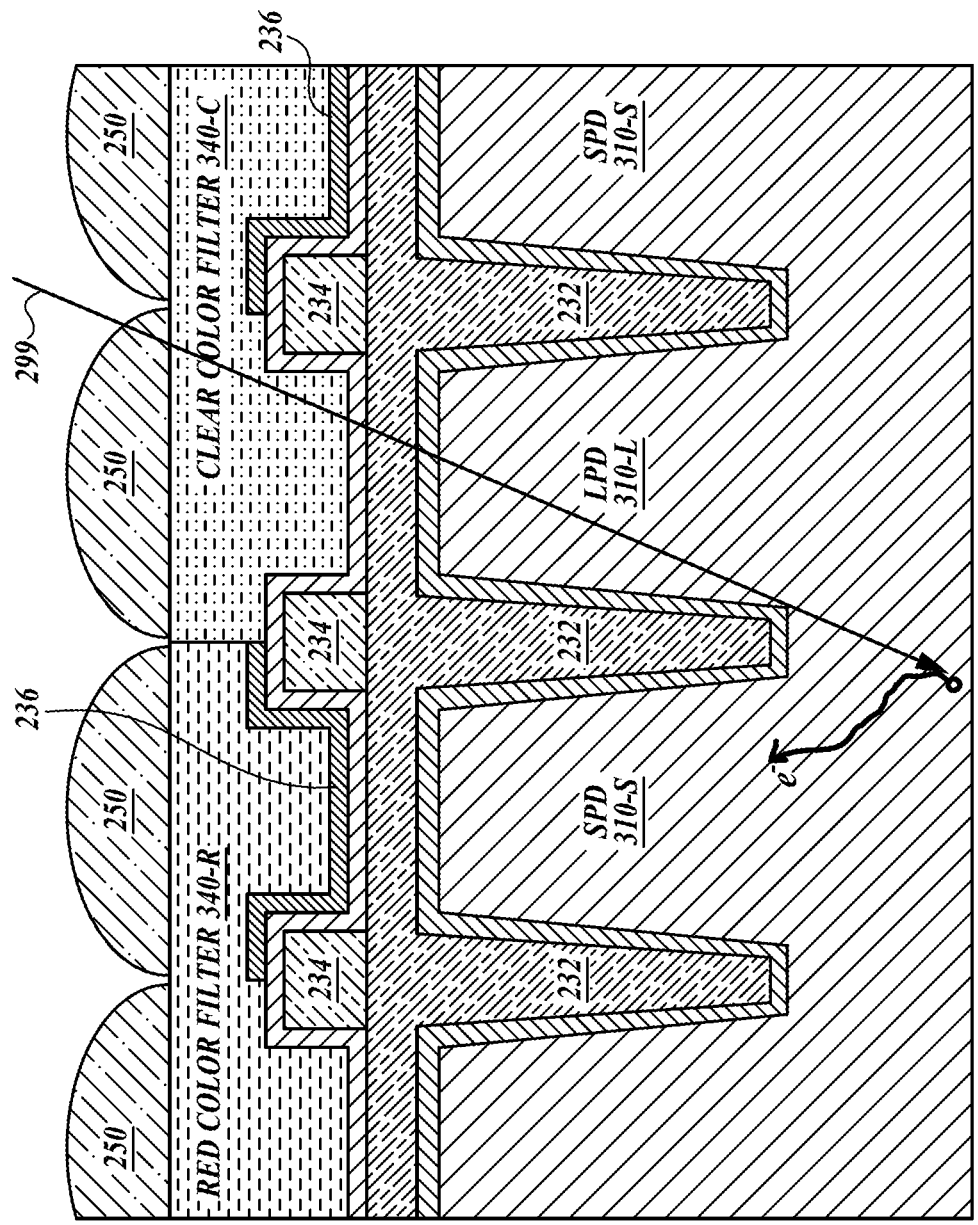
FIGS. 5 and 6 are side cross-sectional views of photodiode arrangements in accordance with embodiments of the present technology.
Figure 6:
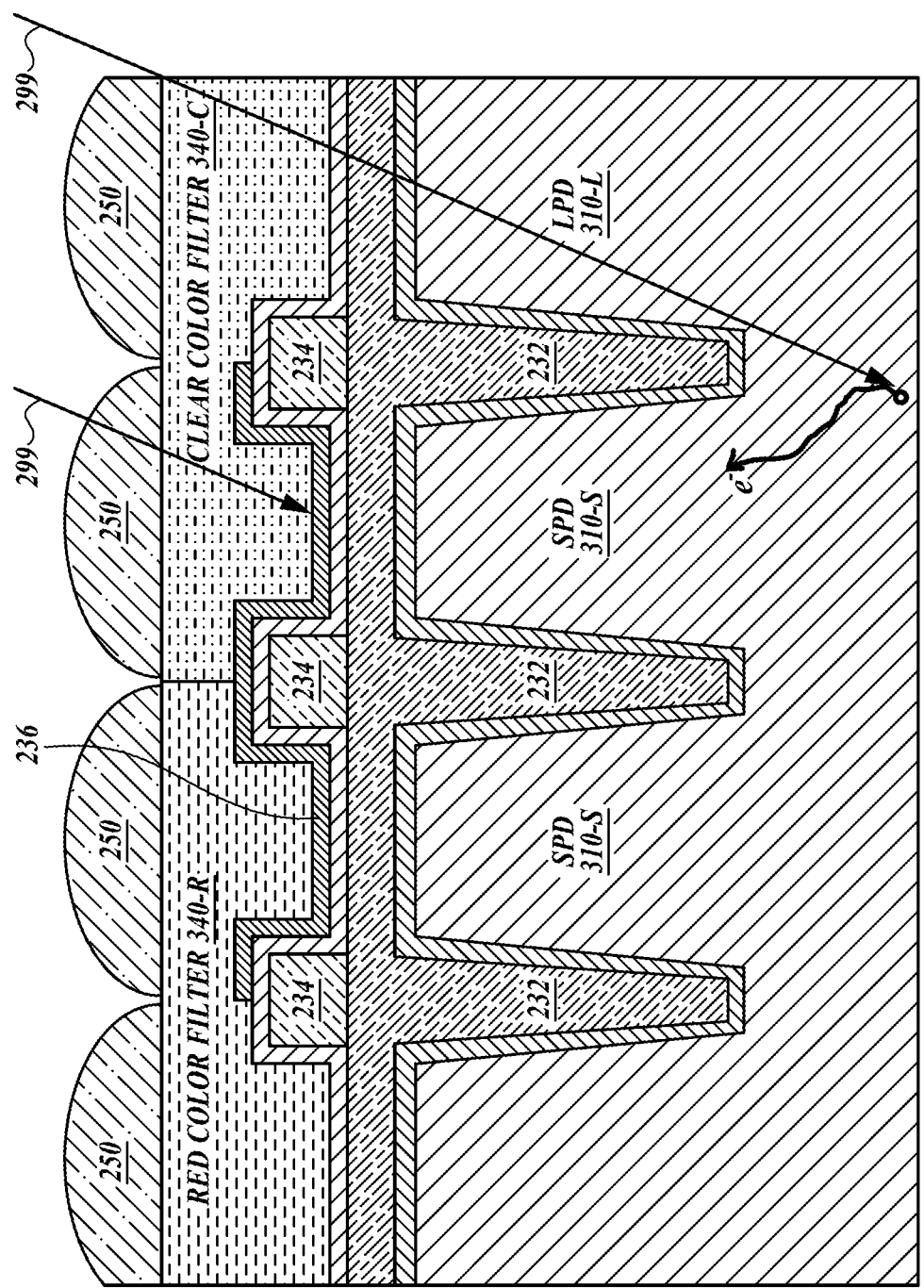

FIGS. 5 and 6 are side cross-sectional views of photodiode arrangements in accordance with embodiments of the present technology. In both cases two pixels are illustrated, the red pixel 340-R being laterally adjacent to the clear pixel 340-C. In operation, image light 299 propagates through the microlens 250 and color filter 340 toward photodiodes SPD and LPD. The photodiodes 310 may be mutually separated by deep trench isolation structures 232 that are aligned under metallization 234. The SPDs 310-S are additionally covered with vertically stacked light attenuation elements 236 that reduce the amount of light reaching the SPD.

FIG. 5 illustrates an arrangement where an SPD 310-S of one color is adjacent to an LPD 310-L of another color. As explained above, stray light arriving from an LPD to an SPD is generally stronger (having not been attenuated by the light attenuation elements 236) and, therefore, being more contaminating, especially so if arriving from an LPD of a different color.

FIG. 6 illustrates an arrangement where an SPD 310-S of one color is adjacent to an SPD 310-S of another color. Here, light 299 passes through the attenuation element 236 before reaching the SPD 310-S. As a result, the SPD 310-S receives light of reduced intensity and consequently transfers stray light of reduced intensity to the neighboring subpixels. The LPD 310-L that receives light 299 that did not pass through the attenuation element 236 generates stronger stray light toward the SPD 310-S. However, this stray light is received by the SPD belonging to the pixel of same color, which generally has a smaller contaminating effect.

Figure 7:
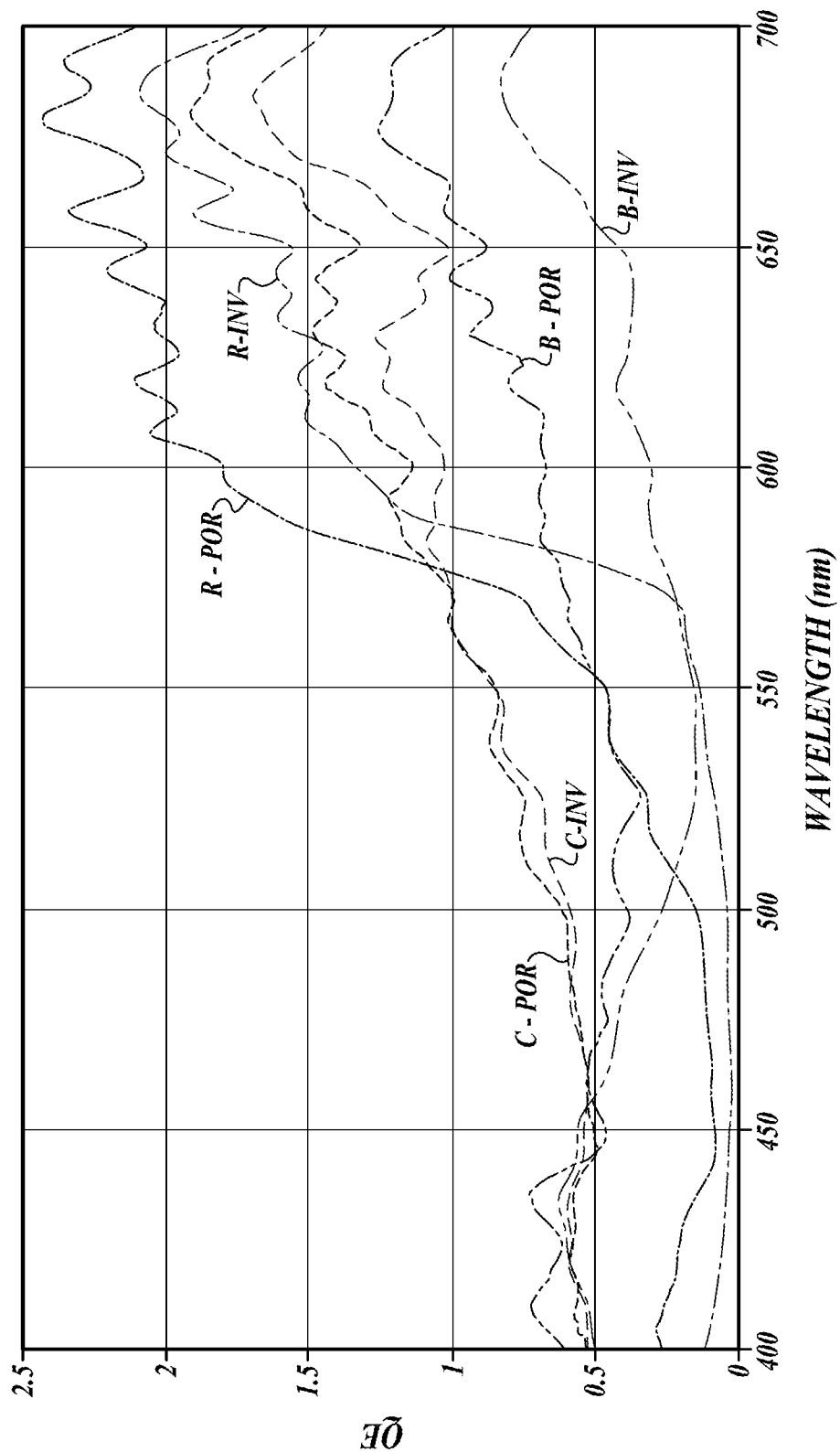
FIG. 7 is a graph of quantum efficiency for different photodiodes in accordance with an embodiment of the present technology.

FIG. 7 is a graph of quantum efficiency for different photodiodes in accordance with an embodiment of the present technology. The horizontal axis indicates wavelength in nanometers. The vertical axis indicates quantum efficiency (QE). The six illustrated curves can be divided into two groups of three curves each. The first group includes quantum efficiency obtained with conventional technology for the photodiodes with red (R), blue (B) and clear (C) color filters. The curves in this group are designated as R-POR, B-POR and C-POR. The second group includes quantum efficiency obtained with inventive technology, again for the photodiodes with red (R), blue (B) and clear (C) color filters. The curves in this group designated as R-INV, B-INV and C-INV.

For example, focusing on the blue photodiodes B-POR and B-INV, for the wavelengths in the range of about 400 nm to about 500 nm, which are representative of the blue light, the quantum efficiency is comparable for both the B-POR and B-INV photodiode. However, looking at the wavelengths from about 650 nm to about 700 nm, which are representative of the red light, the quantum efficiency of the B-INV photodiode is significantly lower than the quantum efficiency of the B-POR photodiode. This indicates a reduced cross-talk of the B-INV photodiode (i.e., the photodiode according to the inventive technology) in comparison to the B-POR photodiode (i.e., the photodiode according to the conventional technology). Comparable conclusions may be derived for the wavelengths in the range of about 500 nm to about 600 nm, corresponding to the green light. Furthermore, analogous conclusions may be derived when comparing the inventive and conventional C and R photodiodes. Therefore, for the illustrated embodiments, the photodiodes according to the inventive technology (INV) and the conventional technology (POR) have comparable quantum efficiencies within their design wavelength ranges, while the photodiodes according to the inventive technology (INV) are less impacted by the cross-talk at their non-design wavelength.

Many embodiments of the technology described above may take the form of computer- or controller-executable instructions, including routines executed by a programmable computer or controller. Those skilled in the relevant art will appreciate that the technology can be practiced on computer/controller systems other than those shown and described above. The technology can be embodied in a special-purpose computer, application specific integrated circuit (ASIC), controller or data processor that is specifically programmed, configured or constructed to perform one or more of the computer-executable instructions described above. Of course, any logic or algorithm described herein can be implemented in software or hardware, or a combination of software and hardware.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:
   a plurality of pixels arranged in rows and columns of a pixel array that is disposed in a semiconductor substrate, wherein each pixel comprises a plurality of large subpixels (LPDs) and at least one small subpixel (SPD); and
   a plurality of color filters disposed over individual subpixels;
   wherein each individual SPD is laterally adjacent to at least one other SPD.

2. The image sensor of claim 1, wherein LPDs and SPDs that are mutually laterally adjacent are vertically stacked by the color filters of same color.

3. The image sensor of claim 2, wherein SPDs that are mutually laterally adjacent are vertically stacked by the color filters of different colors.

4. The image sensor of claim 1, wherein the color filters are selected from a group consisting of a Blue (B) color filter, a Clear (C) color filter, and a Red (R) color filter.

5. The image sensor of claim 1, wherein each pixel comprises 3 LPDs and 1 SPD.

6. The image sensor of claim 1, wherein each individual SPD is diagonally adjacent to one other SPD.

7. The image sensor of claim 6, wherein each individual SPD is laterally adjacent to two other SPDs.

8. The image sensor of claim 2, wherein SPDs are grouped as clusters of 4 SPDs.

9. The image sensor of claim 1, further comprising a plurality of microlenses disposed over corresponding plurality of color filters.

10. The image sensor of claim 1, further comprising a plurality of light attenuation elements disposed over corresponding plurality of SPDs.

11. A method for manufacturing an image sensor, comprising:
    forming a plurality of pixels in a semiconductor substrate, wherein individual pixels are arranged in rows and columns of a pixel array, and wherein each pixel comprises a plurality of large subpixels (LPDs) and at least one small subpixel (SPD); and
    disposing a plurality of color filters over individual subpixels;
    wherein each individual SPD is laterally adjacent to at least one other SPD.

12. The method of claim 11, wherein LPDs and SPDs that are mutually laterally adjacent are vertically stacked by the color filters of same color.

13. The method of claim 12, wherein SPDs that are mutually laterally adjacent are vertically stacked by the color filters of different colors.

14. The method of claim 12, wherein the color filters are selected from a group consisting of a Blue (B) color filter, a Clear (C) color filter, and a Red (R) color filter.

15. The method of claim 11, wherein each pixel comprises 3 LPDs and 1 SPD.

16. The method of claim 11, wherein each individual SPD is diagonally adjacent to one other SPD.

17. The method of claim 16, wherein each individual SPD is laterally adjacent to two other SPDs.

18. The method of claim 16, wherein SPDs are grouped as clusters of 4 SPDs.

19. The method of claim 11, further comprising a plurality of microlenses disposed over corresponding plurality of color filters.

20. The method of claim 11, further comprising a plurality of light attenuation elements disposed over corresponding plurality of SPDs.

* * * * *